United States Patent

Kambe et al.

[11] Patent Number: 5,986,206
[45] Date of Patent: Nov. 16, 1999

[54] SOLAR CELL

[75] Inventors: Nobuyuki Kambe, Menlo Park, Calif.; Peter S. Dardi, St. Paul, Minn.

[73] Assignee: NanoGram Corporation, Fremont C, Calif.

[21] Appl. No.: 08/988,103

[22] Filed: Dec. 10, 1997

[51] Int. Cl.$^6$ .................... H01L 51/20; H01L 31/0236
[52] U.S. Cl. .................... 136/263; 136/250; 136/256; 136/246; 136/259; 257/465; 257/466; 257/461; 257/40; 257/184; 438/63; 438/82
[58] Field of Search .................... 136/263, 250, 136/256, 246, 259; 257/465, 466, 461, 40, 184; 438/63, 82

[56] References Cited

U.S. PATENT DOCUMENTS

| | | | |
|---|---|---|---|
| 4,367,369 | 1/1983 | Mizutani et al. | 136/263 |
| 4,439,410 | 3/1984 | Santén et al. . | |
| 4,568,791 | 2/1986 | Kawai . | |
| 4,795,242 | 1/1989 | Wudl et al. . | |
| 4,828,875 | 5/1989 | Im et al. . | |
| 4,947,219 | 8/1990 | Boehm . | |
| 5,202,061 | 4/1993 | Angelopoulos et al. . | |
| 5,254,648 | 10/1993 | Destryker et al. . | |
| 5,331,183 | 7/1994 | Sariftci et al. | 136/263 |
| 5,403,439 | 4/1995 | Matthews . | |
| 5,413,226 | 5/1995 | Matthews et al. . | |
| 5,454,880 | 10/1995 | Sariftci et al. . | |
| 5,503,898 | 4/1996 | Lauf | 136/256 |
| 5,545,443 | 8/1996 | Yamada et al. . | |
| 5,561,026 | 10/1996 | Aoki . | |
| 5,625,527 | 4/1997 | Hatada . | |
| 5,635,581 | 6/1997 | Chiang et al. . | |

FOREIGN PATENT DOCUMENTS

| | | |
|---|---|---|
| 195 44 977 A1 | 6/1996 | Germany . |
| 3-76273 | 4/1991 | Japan . |
| 4-207085 | 7/1992 | Japan . |
| 6-211511 | 8/1994 | Japan . |
| 6-244440 | 9/1994 | Japan . |
| WO 94/05045 | 3/1994 | WIPO . |
| WO 97/12082 | 4/1997 | WIPO . |

OTHER PUBLICATIONS

Patent Abstract of Japan, abstract for JP 63–308807, Dec. 1988.
Patent Abstracts of Japan, abstract for JP 05–036999, Feb. 1993.
English translation of JP 06–211511, Aug. 1994.
"Nanoscale carbon blacks produced by $CO_2$ laser pyrolysis", Bi et al., J. Mater. Res., vol. 10, No. 11, Nov. (1995) pp. 2875–2884.
"Two Different Fullerenes Have the Same Cyclic Voltammetry," Allemand et al. J. Am Chem. Soc. (1991), vol. 113: 1050–1051 (Month Unknown).
"Mechanical properties of vapor–grown carbon fibres," G.G. Tibbetts and C.P. Beetz, Jr. "Journal of Physics D", (1987) pp. 292–297 (Month Unknown).
"Solid State Effects in $C_{60}$: Relationship Between Phase Transition And Optical Properties, Intermolecular Charge Transfer Excitation, and Luminescence Quenching By Oxygen", Physics and Chemistry of Fullerenes and Derivatives, pp. 238–259 (Date Unknown).

(List continued on next page.)

Primary Examiner—Alan Diamond
Attorney, Agent, or Firm—Westman, Champlin & Kelly P.A.; Peter S. Dardi

[57] ABSTRACT

Polymer based solar cells incorporate nanoscale carbon particles as electron acceptors. The nanoscale carbon particles can be appropriate carbon blacks, especially modified laser black. Conducting polymers are used in the solar cells as electron donors upon absorption of light. Preferred solar cell structures involve corrugation of the donor/acceptor composite material such that increased amounts of electricity can be produced for a given overall area of the solar cell.

20 Claims, 2 Drawing Sheets

OTHER PUBLICATIONS

"Electric Field Induces Luminescence Quenching In $c_{60}$ Films: Evidence Of Intermolecular Charge Transfer Excitation", Kazaoui et al. Physics and Chemistry of Fullerenes and Derivatives, pp. 242–245 (Date Unknown).

G.G. Tibbetts et al., "An Adsorption–Diffusion Isotherm and its Application To The Growth of Carbon Filaments On Iron Catalyst Particles," Carbon, vol. 25 No. 3. (1987) pp. 367–775 (Month Unknown).

"Direct Thermal Fluorination of Diamond Surfaces", Okino et al., vol. 1, Extended Abstracts and Program 23rd Conference of Carbons. (1997) pp. 184–185. (Month Unknown). Sections 20.2.4–20.2.6–from Science of Fullerences and Carbon Nanotubes, edited by M.S. Dresselhaus et al., (academic Press, 1996). (Month Unknown).

"Wavelength Dependence of Junction Characteristics of Poly (3–alkylthiophene)/$C_{60}$ Layer", Morita et al., Japan J. of Applied Phys. vol. 32 (1993) L873–894 (Month Unknown).

Photoconductivity Detected ESR On Undoped $C_{60}$ Films, Eickelkamp et al., Physics and Chemistry Of Fullerenes And Derivatives, pp. 258–260. (Date Unknown).

L.S. Roman et al., "Photodiode Performance and Nanstructure of Polythiophene/$C_{60}$ Blends" *Advanced Materials*, vol. 9, No. 15, pp. 1164–1168, Dec. 1997.

N.S. Sariciftci et al., "Photovoltaic Cells Using Molecular Photoeffect at the Semiconducting Polymer/Buckminsterfullerene Heterojunctions", International Conference on Solid State Devices and materials, pp. 781–783, Aug. 1993.

SOLAR CELL

FIELD OF THE INVENTION

The invention relates to solar cells based on conducting polymers and methods for the production of solar cells.

BACKGROUND OF THE INVENTION

Solar cells are one of the most important new energy sources that have become available in the past several decades. Considerable effort has gone into solar cell development, and solar cells are currently being applied in the production of some consumer electronics such as hand-held calculators. While significant progress has been made in solar cell development, increased energy conversion efficiency and cost reductions are thought to be necessary to make large area solar cells practical for wider use for houses, automobiles or mobile communications.

Most previous work relating to solar cells has involved silicon based semiconductor materials. Generally, solar cells involve p-n junctions where charge separation across the junction forms the basis for the current production. Recently, solar cells have been produced from junctions formed from $C_{60}$ fullerenes as electron acceptors in contact with a conducting polymer films acting as electron donors. The fullerenes act as an electron acceptor due to their high electron affinity. The conducting polymers act as electron donors following light adsorption.

SUMMARY OF THE INVENTION

Conducting polymer based solar cells can be produced using electron acceptors in the form of certain carbon particles. In addition, carbon particles can be halogenated to increase their electron affinity. The preferred carbon particles have nanoscale diameters with a correspondingly large surface area to provide for increased electron accepting ability per unit weight of material. Carbon particles generally are a convenient and relatively inexpensive material for the incorporation into solar cells. Improved solar cell structures are described. In particular, a corrugated solar cell structure is described that can significantly increase the effective electrical capacity of a solar cell for a given area (foot print) of the overall solar cell structure.

In one aspect, the invention features a solar cell including a donor/acceptor composite disposed between a first electrode that is at least partially transparent to light, and a second electrode, the donor/acceptor composite including a polymer that absorbs light to become an electron donor and carbon particles that function as an electron acceptor having an average diameter from about 5 nm to about 100 nm. The light absorbing polymer can be a polymer that absorbs light to form a charge transfer state, and the light absorbing polymer can be a conjugated polymer. Preferred photoconductive polymers include poly(phenylene vinylene) or substituted poly(phenylene vinylene). The donor/acceptor composite can be corrugated.

The carbon particles can be formed by laser pyrolysis. Preferred carbon particles are semiconducting. The carbon particles preferably have an average diameter from about 5 nm to about 30 nm. The carbon particles can be embedded in a binder to form a layer in contact with a layer of the light-sensitive, electron-donating polymer. The carbon particles can be adjacent a surface of the light-sensitive, electron-donating polymer. In other embodiments, the carbon particles are distributed through a portion of the light-sensitive, electron-donating polymer.

In another aspect, the invention features a method of forming a solar cell including the step of placing a donor/acceptor composite between a first electrode that is at least partially transparent to light and a second electrode, the donor/acceptor composite including a polymer that absorbs light to become an electron donor, and carbon particles having an average diameter from about 5 nm to about 100 nm with suitable electronic properties to act as an electron acceptor.

In another aspect, the invention features a method of generating electricity including the step of exposing a solar cell to light, the solar cell including a donor/acceptor composite between a first electrode that is at least partially transparent to light and a second electrode, the donor/acceptor composite including a polymer that absorbs light to become an electron donor, and carbon particles having an average diameter from about 5 nm to about 100 nm.

In another aspect, the invention features a solar cell including a donor/acceptor composite disposed between a first electrode that is at least partially transparent to light, and a second electrode, the donor/acceptor composite including a polymer that absorbs light to become an electron donor, and an electron acceptor, wherein the donor/acceptor composite is corrugated such that the donor/acceptor composite has a surface area that is at least 50 percent greater than any planar projected area of the composite. The electron acceptor can include fullerenes. In alternative embodiments, the electron acceptor includes carbon particles having an average diameter between about 5 nm and about 100 nm.

In some embodiments, the donor/acceptor composite is corrugated such that the donor/acceptor composite has a surface area that is at least 100 percent greater than any planar projected area of the composite. The electron acceptor can include carbon particles or fullerenes, where the carbon particles or fullerenes are embedded in a binder to form a layer in contact with a layer of the light-sensitive, electron-donating polymer. Similarly, the electron acceptor can include carbon particles or fullerenes, where the carbon particles or fullerenes are adjacent a surface of the light-sensitive, electron-donating polymer. In other embodiments, the carbon-containing electron acceptor includes carbon particles or fullerenes, where the carbon particles or fullerenes are distributed through a portion of the light-sensitive, electron-donating polymer.

Other features and advantages are evident from the detailed description of the invention and claims presented below.

DETAILED DESCRIPTION OF THE INVENTION

Solar cells are described that incorporate electron donors based on conductive polymers. A variety of advances are described including the use of relatively inexpensive and versatile carbon particles as a substitute for fullerenes. These carbon particles can be combined with a photoconducting polymer to form a donor/acceptor composite. The solar cell structures are placed between electrodes to complete the solar cell. Preferred embodiments have substantially nonplanar light absorbing surfaces to increase the current for a given amount of planar surface area of the cell. In other words, the effective surface area of the cell is increased by corrugating the donor/acceptor composite. Suitable materials are described for producing a corrugated photoconversion layers.

A. Solar cell Structure

Figure 1:
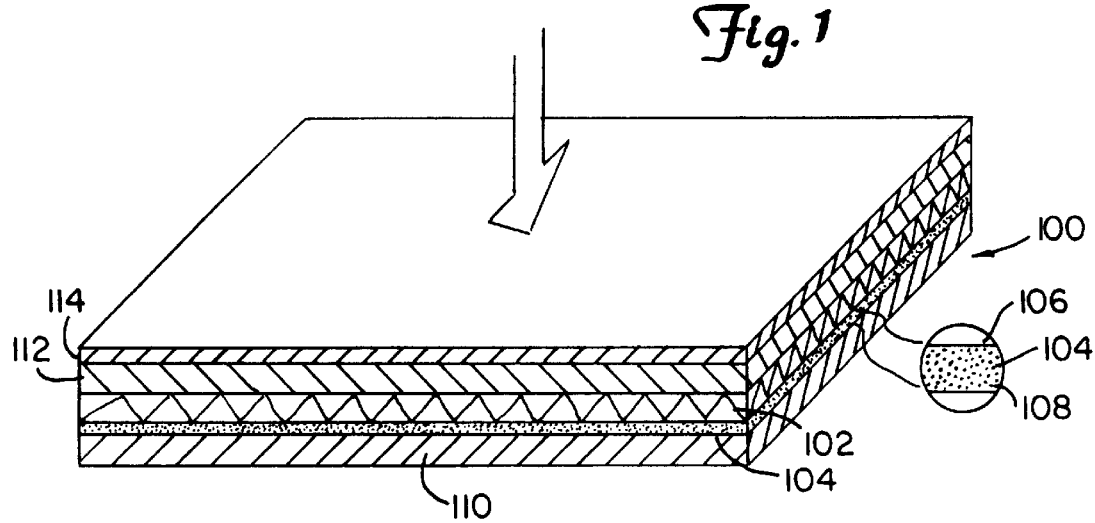
FIG. 1 is a schematic, perspective view of a generally planar embodiment of a solar cell of the invention with an insert depicting the acceptor layer.

Referring to FIG. 1, a first embodiment of a solar cell 100 generally includes an electron donor layer 102 that responds to light by becoming an electron donor. An electron acceptor layer 104 is located adjacent to the electron donor layer 102. The electron acceptor layer 104 can include electron accepting particles 106 optionally within a binder 108, as shown in the insert of FIG. 1. Together the electron donor (D) layer 102 and the electron acceptor (A) layer 104 form a D-A type heterojunction (donor/acceptor composite) that functions analogous to a semiconductor p-n junction.

The interface of electron donor layer 102 and electron acceptor layer 104 can be substantially planar such that the area of the interface is approximately equal to the area of the individual layers. Alternatively, the interface can be uneven or rough such that the area of the interface is substantially larger than the area of either electron donor layer 102 or electron acceptor layer 104. The area of the electron donor layer 102 and the electron acceptor layer 104 are defined to ignore any surface roughness.

The layer of electron acceptors is in contact with an electrically conducting electrode 110. Similarly, the electron donor layer 102 is in contact with a transparent electrode 112. The transparent electrode 112 can be optionally protected with an inert transparent layer 114. The solar cell 100 can be mounted on a substrate support in contact with electrode 110. Light is generally directed at the transparent electrode 112 such that the light is transmitted to electron donor layer 102. The transparent electrode can include an anti-reflective surface with respect to desirable wavelengths of light. Following standard practice, an antireflective coating is designed such that light reflected from the two surfaces of the antireflective coating approximately cancel through destructive interference.

Figure 2:
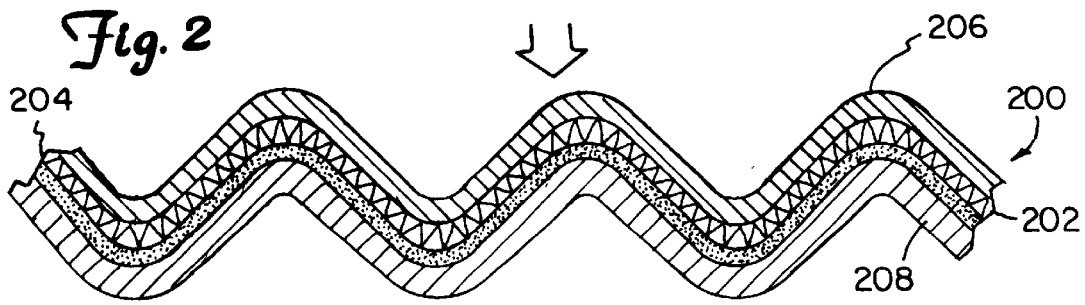
FIG. 2 is a fragmentary, side view of a corrugated embodiment of a solar cell of the invention.

In an alternative embodiment, at least the electron donor layer and the layer of electron acceptors (i.e. the donor/acceptor composite) form a substantially nonplanar structure. Referring to FIG. 2, high surface area solar cell 200 includes a non-planar electron donor layer 202. A similarly shaped layer of electron acceptors 204 is adjacent to the electron donor layer 202. The corrugation is independent of any surface roughness as described above with respect to the interface between the electron donor layer and the electron acceptor layer. The area of the electron donor layer 202 and the electron acceptor layer 204 are defined to account for corrugation of the layers 202, 204.

Preferably, transparent electrode 206 and electrode 208 have comparable shapes, as depicted schematically in FIG. 2. Electrode 208 can be transparent or reflective, if desired. An optional transparent layer can be used to cover transparent electrode 206 that can have the same shape or not as the transparent electrode 206. Again, a substrate support generally holds high surface area solar cell 200, which may or may not have a shape comparable to electrode 208.

The shape of the composite of the electron donor layer 202 and the electron acceptor layer 204 can be selected to yield a desired amount of current production. Production considerations given a particular selection of materials may influence the particular shape and degree of corrugation. A larger degree of corrugation increases the effective surface area while increasing the total amount of material used for a fixed cross sectional thickness.

For a given surface area, the shape of the corrugation can be selected, as desired. For example, the curvature can be relatively localized to yield a more pleated structure. Alternatively, the curvature can be spread through the material to produce a more wave-like effect. It is possible to produce corrugation to increase the surface area of the electron donor layer many times the area of a planar projection of the electron donor layer. At an extreme the components can be essentially folded to produce a tightly pleated structure. The surface area is then determined from the height of the pleats.

Figure 3:
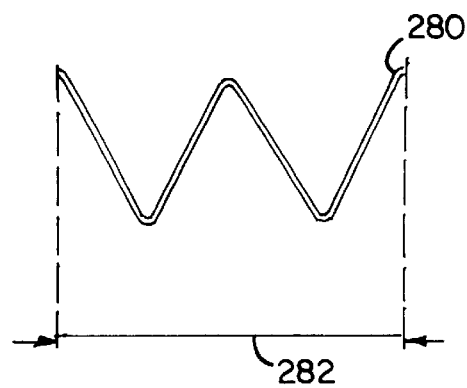
FIG. 3 is fragmentary, side view of a corrugated solar cell embodiment and a planar projection.

The degree of corrugation preferably produces a surface area of the electron donor layer at least about 40 percent greater, more preferably at least about 100 percent greater and even more preferably at least about 300 percent greater than the area of any planar projection of the electron donor layer. Referring to FIG. 3, a corrugated solar cell 280 including, at least, an electron donor layer and associated electron acceptor particles is depicted where solar cell 280 has a surface area of about 200 percent of the area of planar projection 282 of solar cell 280. In general, a particular projection plane is a natural plane, if it exists, based on being a tangent plane on which the donor layer would rest if the tangent plane were a solid surface. Planes tangent to the natural plane yield equivalent projections. For solar cells with a large number of corrugations, projection onto a plane parallel to the natural plane gives a value for the projected area that is a maximum or close in value to a maximum value for the projected area. The solar cell 280 can have gross curvature apart from the corrugation, if desired.

Figure 4:
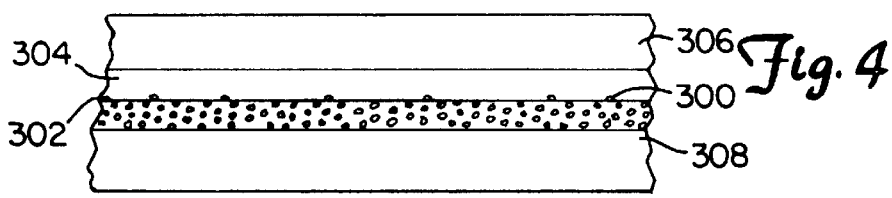
FIG. 4 is a fragmentary, side view of a solar cell embodiment having electron acceptor particles layered onto the surface of an electron donor layer.

While the electron donor layer and the electron acceptor layer have been described as distinct layers, they do not need to be distinct layers. For example, particles 300 corresponding to the electron acceptors can be layered onto a surface 302 of the electron donor layer 304, as depicted schematically in FIG. 4 to form the donor/acceptor composite. Transparent electrode 306 is in contact with electron donor layer 304. An electrode 308 contacts particles 300.

Figure 5:
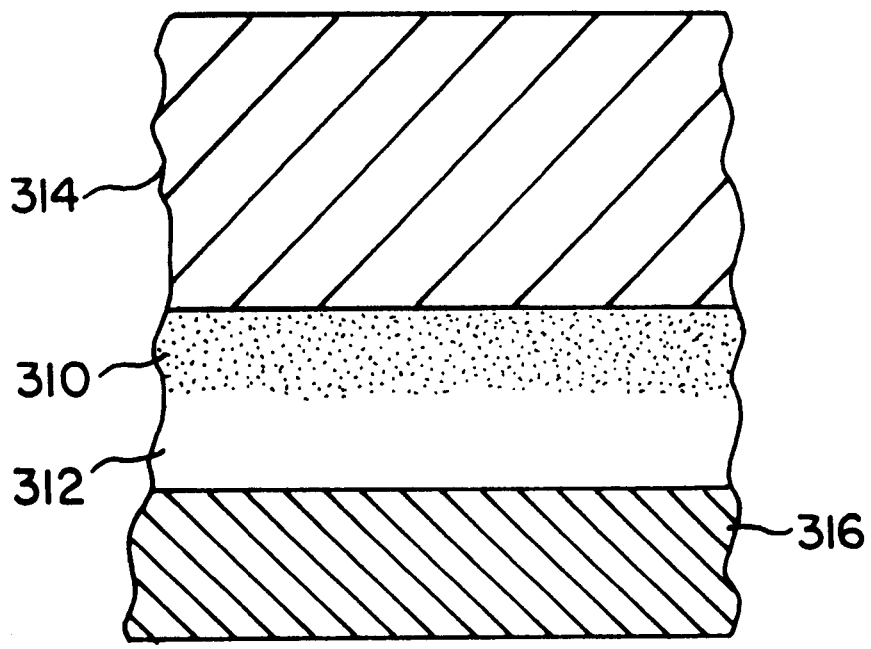
FIG. 5 is a fragmentary, side view of a solar cell embodiment having electron acceptor particles distributed within a portion of the electron donor layer.
Figure 6:
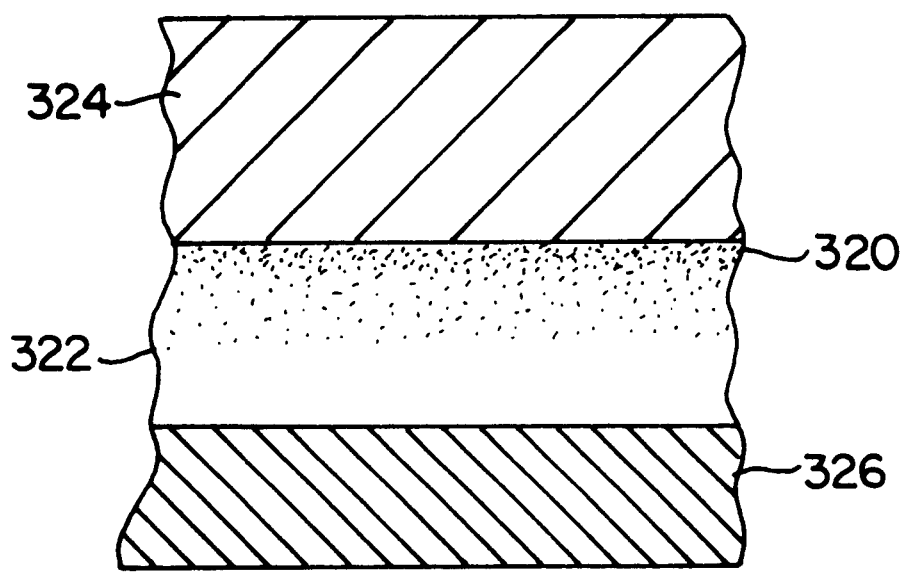
FIG. 6 is a fragmentary, side view of a solar cell embodiment having electron acceptor particles distributed non-uniformly within a portion of the electron donor layer.

Alternatively, the particles 310 can be distributed through a portion of the electron donor layer 312, as depicted schematically in FIG. 5 to form the donor/acceptor composite. Particles 310 are distributed through a portion of electron donor layer 312 positioned toward electrode 314. The portion of electron donor layer 312 free of particles 310 is oriented toward transparent electrode 316. The distribution of particles 320 through a portion of electron donor layer 322 can be nonuniform, as depicted schematically in FIG. 6. Generally, a higher density of particles 320 is located on the side of electron donor layer 322 toward electrode 324. The portion of electron donor layer 322 toward transparent electrode 326 is free of particles 320 or has a low density of particles 320.

A solar collector generally would include a plurality of individual solar cells. Generally, a plurality of cells are connected appropriately both in series and in parallel to obtain the desired voltage and current.

B. Materials

The electron donor material generally becomes an electron donor upon exposure to light. Suitable materials include π-electron semiconducting (conjugated) polymers. Exposure to light excites a pi electron of these polymers into a conduction (i.e., excited state) orbital. In other words, the polymer absorbs light to produce an excited electronic state that is susceptible to forming a charge transfer state. A range of suitable polymers are disclosed in U.S. Pat. No. 5,454,880, incorporated herein by reference, for example the list in FIG. 1. Particularly preferred polymers include phenylene vinylene polymers, such as poly(2-methoxy, 5 (-2'-ethyl-hexyloxy)-p-phenylene vinylene). The polymer layers can be extruded, spin cast or the like. The polymer should have a thickness that allows absorption of light by the polymer in the vicinity of the interface with the electron accepting particles.

Compounds used as the electron acceptor should function to accept electrons from the conducting polymer component following absorption of light. Suitable acceptor compounds should have a sufficiently high value of electronegativity. For example, electron accepting semiconductor particles can be used as the electron acceptor. Production of suitable semiconducting particles is described in U.S. Pat. No. 5,413,226, incorporated herein by reference.

Preferred electron acceptors are carbon-containing compounds. Fullerenes such as Buckminsterfullerene, $C_{60}$, are known to be good electron acceptors generally capable of accepting multiple electrons. Fullerene $C_{70}$ has been found to have a similar response in cyclic voltammetry studies, as described by P.-M. Allemand et al., J. Am. Chem. Soc. 113:1050–1051 (1991). U.S. Pat. No. 5,454,880 describe other organic compounds that can serve as suitable electron acceptors including, for example, polyquinoline and tetracyanoquinodimethane.

Alternative electron acceptors include selected carbon blacks. Carbon blacks include a variety of carbon particles produced by hydrocarbon dehydrogenation. A variety of methods can be used to produce carbon blacks including, for example, thermal decomposition of natural gas (thermal black), exothermic decomposition of acetylene (acetylene black), decomposition of ethylene in a plasma arc (plasma black), partial combustion of natural gas (channel black) and partial combustion of oil droplets (furnace black). Carbon blacks can have a variety of morphologies depending on the process for making them and the conditions during the production process. In particular, the carbon black particles generally include various amounts of graphitic domains as well as less ordered (amorphous) regions.

Carbon particles such as carbon black also exhibit a variety of properties presumably related to the particle morphology. Carbon black particles can be selected to exhibit electron affinities that make the particles suitable for use as electron acceptors in a solar cell. Preferred carbon blacks are semiconductors. Furthermore, preferred carbon blacks have diameters less than about 100 nm and more preferably less than about 30 nm. Small diameter particles have higher surface area per unit weight such that they can act as more effective electron acceptors.

Nanoscale carbon particles have been produced by laser pyrolysis. Their production is described in X.-X. Bi et al., "Nanoscale carbon blacks produced by $CO_2$ laser pyrolysis," J. Material Res. 10:2875–2884 (1995). Because of the small size of these carbon particles (diameters about 30 nm), they have very large surface areas. Carbon blacks generally have complex particle morphologies. Laser black (carbon black produced by laser pyrolysis) are observed to have more disorder than corresponding thermally formed carbon blacks. It was also observed that heat treatment at temperatures up to about 2800° C. increase the graphitic character of the particles. The degree of heat treatment can be varied to alter the performance of the particles as electron acceptors.

In addition, the carbon particles and fullerenes can be halogenated to improve their performance as electron acceptors with fluorination being especially preferred. Fluorination can be performed, for example, using a gas including elemental fluorine ($F_2$). Fluoridation can also be performed using hydrofluoric acid. Chlorinated fullerenes also have been produced by the ultraviolet irradiation of fullerene/chlorine mixtures in chlorinated solvents.

The transparent electrode can be formed from indium oxide, tin oxide, indium tin oxide, a thin layer of metal such as gold or silver, or the like. The transparent electrode may only be partially transparent to light. The electrode can include an antireflective coating. The electrode in contact with or in the vicinity of the electron acceptors can be made from a similar transparent material or, alternatively, from nontransparent conductors including other or thicker metal layers. The layers can be laminated together, or the polymer layers can be formed on the electrode layers by spin coating, extrusion or the like. Metal electrodes can be vapor deposited if the surface on which it is to be deposited is sufficiently stable.

The electron donor/electron acceptor composite preferably is relatively thin to yield an efficient structure without using unnecessary amounts of material. The electron acceptor particles can be deposited appropriately depending on the desired final structure. If the acceptor particles form a stand alone layer, they can be directly deposited on an adjacent layer, generally the donor layer. If the acceptor particles are within a polymer binder, the acceptor particles can be mixed with the polymer as a melt or a in solution with a solvent prior to formation of a layer.

Formation of a donor layer with acceptor particles embedded in the layer can be performed by making a layer of acceptor particles on the donor layer followed by calendering of the coated polymer with or without the application of heat or by other suitable methods. Alternatively, formation of a donor layer with acceptor particles embedded within a portion of the layer can involve formation of a donor layer with acceptor particles dispersed throughout followed by lamination with a second donor layer without acceptor particles, coextrusion of two layers simultaneously, application of the acceptor particles to the donor layer at a suitable point in its formation such that the acceptor particles can diffuse partially into the donor layer, or other appropriate technique.

Any corrugation can be performed simultaneously with the formation of the electron donor/electron acceptor composite or following formation of the electron donor/electron acceptor composite to produce the high surface area layer. The corrugation can be formed by any desired technique for processing polymer films. For example, the polymer film can be formed on a corrugated surface that serves as the support or as an electrode. If the film is sufficiently elastic, the corrugation can be performed in a variety of ways following formation of the film.

The embodiments described above are intended to be representative and not limiting. Additional embodiments of the invention are within the claims. As will be understood by those skilled in the art, many changes in the methods and apparatus described above may be made by the skilled practitioner without departing from the spirit and scope of the invention, which should be limited only as set forward in the claims which follow.

What is claimed is:

1. A solar cell comprising a donor/acceptor composite disposed between a first electrode that is at least partially transparent to light and a second electrode, the donor/acceptor composite comprising a light-absorbing polymer that absorbs light to become an electron donor and carbon particles that function as an electron acceptor having an average diameter from about 5 nm to about 100 nm.

2. The solar cell of claim 1 wherein the light absorbing polymer comprises a polymer that absorbs light to form a charge transfer state.

3. The solar cell of claim 1 wherein the light absorbing polymer comprises a conjugated polymer.

4. The solar cell of claim 3 wherein the light-absorbing polymer is poly(phenylene vinylene) or substituted poly(phenylene vinylene).

5. The solar cell of claim 1 wherein the carbon particles are formed by laser pyrolysis.

6. The solar cell of claim 1 wherein the carbon particles are semiconducting.

7. The solar cell of claim 1 wherein the carbon particles have an average diameter from about 5 nm to about 30 nm.

8. The solar cell of claim 1 wherein the donor/acceptor composite is corrugated.

9. The solar cell of claim 1 wherein the carbon particles are embedded in a binder to form a layer in contact with a layer of the light-absorbing polymer.

10. The solar cell of claim 1 wherein the carbon particles are adjacent a surface of the light-absorbing polymer.

11. The solar cell of claim 1 wherein the carbon particles are distributed through a portion of the light-absorbing polymer.

12. A method of forming a solar cell comprising placing a donor/acceptor composite between a first electrode that is at least partially transparent to light and a second electrode, the donor/acceptor composite comprising a light absorbing polymer that absorbs light to become an electron donor and carbon particles having an average diameter from about 5 nm to about 100 nm with suitable electronic properties to act as an electron acceptor.

13. A method of generating electricity comprising the step of exposing a solar cell to light, the solar cell comprising a donor/acceptor composite between a first electrode that is at least partially transparent to light and a second electrode, the donor/acceptor composite comprising a light-absorbing polymer that absorbs light to become an electron donor and carbon particles having an average diameter from about 5 nm to about 100 nm.

14. A solar cell comprising a donor/acceptor composite disposed between a first electrode that is at least partially transparent to light and a second electrode, the donor/acceptor composite comprising a light-absorbing polymer that absorbs light to become an electron donor and an electron acceptor, wherein the donor/acceptor composite is corrugated such that the donor/acceptor composite has a surface area that is at least 50 percent greater than any planar projected area of the composite.

15. The solar cell of claim 14 wherein the electron acceptor comprises a fullerene.

16. The solar cell of claim 14 wherein the electron acceptor comprises carbon particles having an average diameter between about 5 nm and about 100 nm.

17. The solar cell of claim 14 wherein the donor/acceptor composite is corrugated such that the donor/acceptor composite has a surface area that is at least 100 percent greater than any planar projected area of the composite.

18. The solar cell of claim 14 wherein the electron acceptor comprises carbon particles or fullerenes, where the carbon particles or fullerenes are embedded in a binder to form a layer in contact with a layer of the light-absorbing polymer.

19. The solar cell of claim 14 wherein the electron acceptor comprises carbon particles or fullerenes, where the carbon particles or fullerenes are adjacent a surface of the light-absorbing polymer.

20. The solar cell of claim 14 wherein the electron acceptor comprises carbon particles or fullerenes, where the carbon particles or fullerenes are distributed through a portion of the light-absorbing polymer.

* * * * *